(12) United States Patent
Takehara et al.

(10) Patent No.: US 8,040,730 B2
(45) Date of Patent: Oct. 18, 2011

(54) NONVOLATILE MEMORY DEVICE

(75) Inventors: Masahito Takehara, Yokohama (JP);
Shoichi Kawamura, Yokohama (JP)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 185 days.

(21) Appl. No.: 12/625,723

(22) Filed: Nov. 25, 2009

(65) Prior Publication Data

US 2010/0135081 A1   Jun. 3, 2010

(30) Foreign Application Priority Data

Nov. 28, 2008   (JP) .................................. 2008-305709
Aug. 7, 2009   (KR) ........................ 10-2009-0072885

(51) Int. Cl.
*G11C 11/34* (2006.01)
*G11C 16/04* (2006.01)
(52) U.S. Cl. .............................. 365/185.18; 365/185.14
(58) Field of Classification Search ............. 365/185.18, 365/185.14, 185.28
See application file for complete search history.

(56) References Cited

U.S. PATENT DOCUMENTS

| 7,602,642 B2 * | 10/2009 | Choi ......................... 365/185.09 |
| 7,757,153 B2 * | 7/2010 | Hwang et al. .................. 714/763 |
| 7,787,305 B2 * | 8/2010 | Kim et al. ................ 365/185.19 |
| 2006/0004970 A1 | 1/2006 | Jeong et al. |
| 2006/0077720 A1 * | 4/2006 | Im ............................ 365/185.28 |

FOREIGN PATENT DOCUMENTS

JP   2006024347   1/2006

* cited by examiner

*Primary Examiner* — Anh Phung
(74) *Attorney, Agent, or Firm* — Volentine & Whitt, PLLC

(57) ABSTRACT

A nonvolatile semiconductor memory device includes a memory cell array and a control circuit configured to control reading and programming operations for reading data from and inputting data to the memory cell array, respectively. The control circuit includes first and second units. The first unit is configured to count a number of bits having logic 0 or a number of bits having logic 1, to set a logic where the counted number is greater than n/2 as an initial state to regenerate programming data, and to perform a programming operation based on the regenerated data, when simultaneously programming the programming data of n bits input for a designated address. The second unit is configured to program a recognition bit for recognizing which of the logic 0 and the logic 1 the initial state of the memory cell of the designated address is in, when the programming operation is performed.

11 Claims, 18 Drawing Sheets

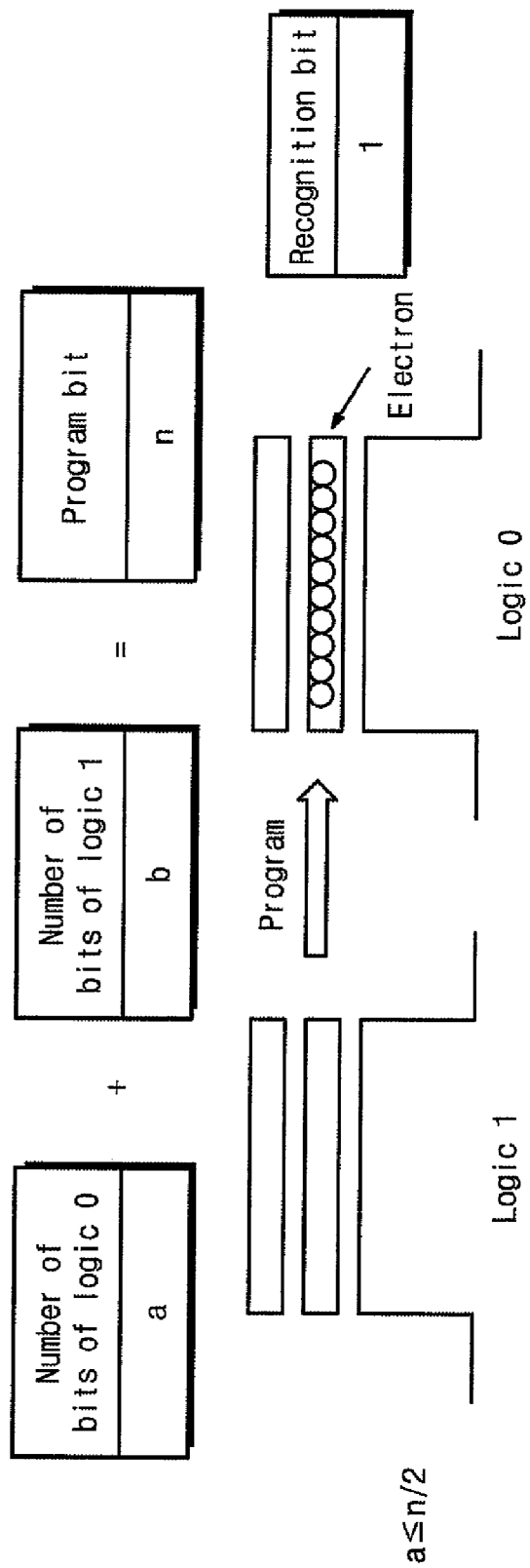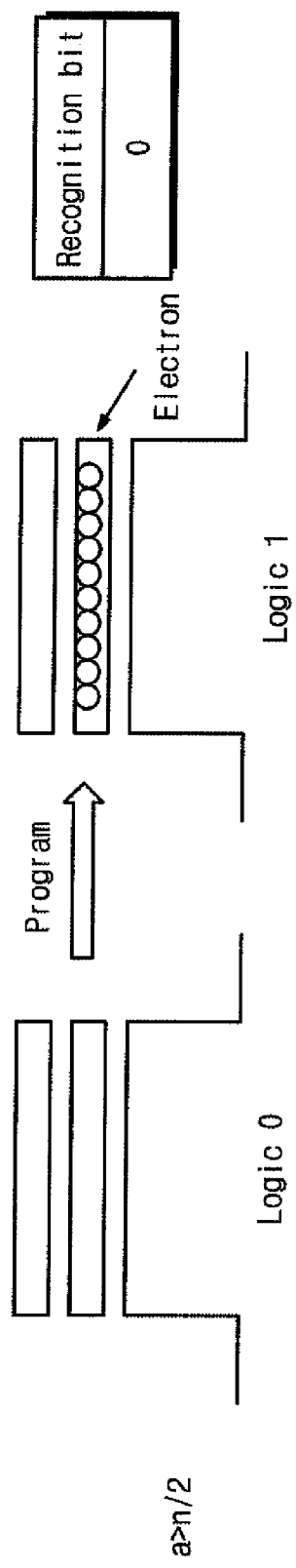

m = Number of bits programmable at one time

Fig. 6

Case in which n bits are 16 bits and m bits are 4 bits

| | Typical worst | | Case ① | | Case ② | | Case ③ | |
| --- | --- | --- | --- | --- | --- | --- | --- | --- |
| | | Use inversion circuit | | use inversion circuit ① | | Use inversion circuit ② | | Use inversion circuit ③ |
| | Invert data 0>n/2 | | Do not invert data 0≤n/2 | | Do not invert data 0=n/2 | | Invert data 0>n/2 | |
| D0 | 0 | 1 | 1 | 1 | 1 | 1 | 0 | 1 |
| D1 | 0 | 1 | 1 | 1 | 1 | 1 | 0 | 0 |
| D2 | 0 | 1 | 1 | 1 | 1 | 1 | 1 | 0 |
| D3 | 0 | 1 | 1 | 1 | 1 | 1 | 1 | 0 |
| D4 | 0 | 1 | 1 | 1 | 0 | 0 | 0 | 1 |
| D5 | 0 | 1 | 0 | 0 | 0 | 0 | 0 | 1 |
| D6 | 0 | 1 | 0 | 0 | 0 | 0 | 1 | 1 |
| D7 | 0 | 1 | 0 | 0 | 0 | 0 | 1 | 1 |
| D8 | 0 | 1 | 1 | 1 | 1 | 1 | 1 | 0 |
| D9 | 0 | 1 | 1 | 1 | 1 | 1 | 1 | 0 |
| D10 | 0 | 1 | 1 | 1 | 1 | 1 | 1 | 0 |
| D11 | 0 | 1 | 1 | 1 | 1 | 1 | 1 | 0 |
| D12 | 0 | 1 | 0 | 0 | 0 | 0 | 0 | 1 |
| D13 | 0 | 1 | 0 | 0 | 0 | 0 | 0 | 1 |
| D14 | 0 | 1 | 0 | 0 | 0 | 0 | 1 | 1 |
| D15 | 0 | 1 | 0 | 0 | 0 | 0 | 1 | 1 |
| Recognition bit | | 0 | | 1 | | 1 | | 0 |
| Number of data 0 | 16 | 1 | 7 | 7 | 8 | 8 | 9 | 8 |
| Number of division programming times | 4 | 1 | 2 | 2 | 2 | 2 | 3 | 2 |

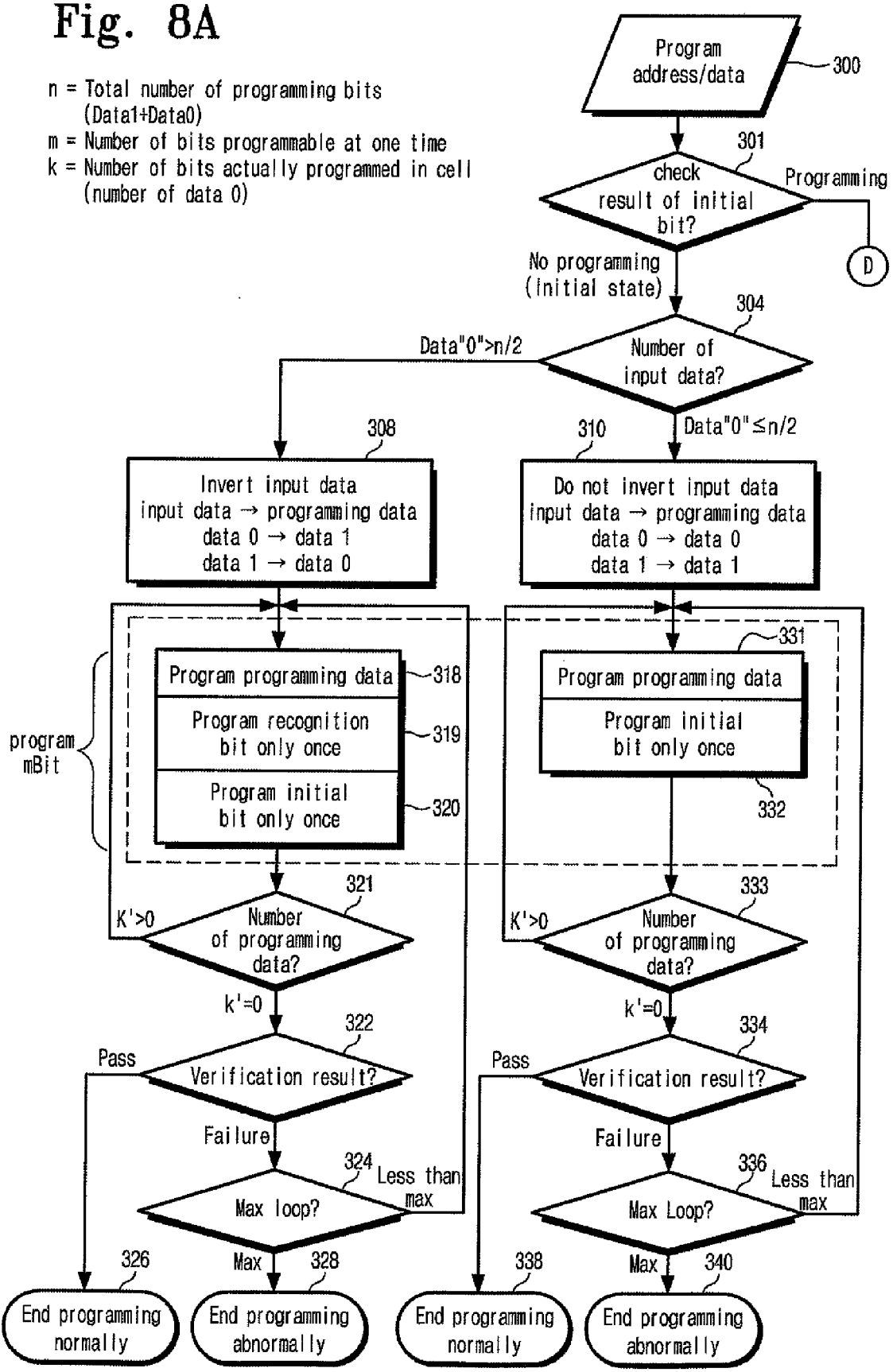

Fig. 9

Case in which n bits are 16 bits and m bits are 4 bits

| | Typical worst | Use inversion circuit | Case ① | use inversion circuit ① | Case ② | Use inversion circuit ② | Case ③ | Use inversion circuit ③ |
|---|---|---|---|---|---|---|---|---|
| D0 | 0 | 1 | 1 | 1 | 1 | 1 | 1 | 0 |
| D1 | 0 | 1 | 1 | 1 | 1 | 1 | 1 | 0 |
| D2 | 0 | 1 | 1 | 1 | 1 | 1 | 1 | 0 |
| D3 | 0 | 1 | 1 | 1 | 1 | 1 | 1 | 0 |
| D4 | 0 | 1 | 1 | 1 | 1 | 1 | 1 | 0 |
| D5 | 0 | 1 | 1 | 1 | 1 | 1 | 1 | 0 |
| D6 | 0 | 1 | 1 | 1 | 1 | 1 | 1 | 0 |
| D7 | 0 | 1 | 1 | 1 | 1 | 1 | 0 | 1 |
| D8 | 0 | 1 | 1 | 1 | 0 | 0 | 0 | 1 |
| D9 | 0 | 1 | 0 | 0 | 0 | 0 | 0 | 1 |
| D10 | 0 | 1 | 0 | 0 | 0 | 0 | 0 | 1 |
| D11 | 0 | 1 | 0 | 0 | 0 | 0 | 0 | 1 |
| D12 | 0 | 1 | 0 | 0 | 0 | 0 | 0 | 1 |
| D13 | 0 | 1 | 0 | 0 | 0 | 0 | 0 | 1 |
| D14 | 0 | 1 | 0 | 0 | 0 | 0 | 0 | 1 |
| D15 | 0 | 1 | 0 | 0 | 0 | 0 | 1 | 1 |
| Recognition bit | / | 0 | / | 1 | / | 1 | / | 0 |
| Initial bit | / | 0 | / | 0 | / | 0 | / | 0 |
| Number of data 0 | 16 | 2 | 7 | 8 | 8 | 9 | 9 | 9 |
| Number of division programming times | 4 | 1 | 2 | 2 | 2 | 3 | 3 | 3 |

Columns grouping:
- Typical worst, Use inversion circuit: Invert data 0 > n/2
- Case ①, use inversion circuit ①: Do not invert data 0 ≤ n/2
- Case ②, Use inversion circuit ②: Do not invert data 0 = n/2
- Case ③, Use inversion circuit ③: Invert data 0 > n/2

Fig. 10

Case in which n bits are 16 bits and m bits are 4 bits

| | Typical worst | | Case ① | | Case ② | | Case ③ | |
|---|---|---|---|---|---|---|---|---|
| | Invert data 0>n/2 | | Do not invert data 0<n/2 | | Do not invert data 0=n/2 | | Invert data 0>n/2 | |
| | | Use inversion circuit | | Use inversion circuit ① | | Use inversion circuit ② | | Use inversion circuit ③ |
| D0 | 0 | 1 | 1 | 1 | 1 | 1 | 1 | 0 |
| D1 | 0 | 1 | 1 | 1 | 1 | 1 | 1 | 0 |
| D2 | 0 | 1 | 1 | 1 | 1 | 1 | 1 | 0 |
| D3 | 0 | 1 | 1 | 1 | 1 | 1 | 1 | 0 |
| D4 | 0 | 1 | 1 | 1 | 1 | 1 | 1 | 0 |
| D5 | 0 | 1 | 1 | 1 | 1 | 1 | 1 | 0 |
| D6 | 0 | 1 | 1 | 1 | 1 | 1 | 1 | 0 |
| D7 | 0 | 1 | 1 | 1 | 1 | 1 | 0 | 1 |
| D8 | 0 | 1 | 1 | 1 | 0 | 0 | 0 | 1 |
| D9 | 0 | 1 | 0 | 0 | 0 | 0 | 0 | 1 |
| D10 | 0 | 1 | 0 | 0 | 0 | 0 | 0 | 1 |
| D11 | 0 | 1 | 0 | 0 | 0 | 0 | 0 | 1 |
| D12 | 0 | 0 | 0 | 0 | 0 | 0 | 0 | 1 |
| D13 | 0 | 1 | 0 | 0 | 0 | 0 | 0 | 1 |
| D14 | 0 | 1 | 0 | 0 | 0 | 0 | 0 | 1 |
| D15 | 0 | 1 | 0 | 0 | 0 | 0 | 1 | 1 |
| Recognition bit | / | 0 | / | 1 | / | 1 | / | 0 |
| Initial bit | / | 0 | / | 0 | / | 0 | / | 0 |
| Number of data 0 | 16 | 2 | 7 | 8 | 8 | 9 | 9 | 9 |
| Number of division programming times | 4 | 1 | 2 | 2 | 2 | 2 | 3 | 2 |

NONVOLATILE MEMORY DEVICE

CROSS-REFERENCE TO RELATED APPLICATIONS

A claim of priority is made to Korean Patent Application No. 10-2009-0072885, filed on Aug. 7, 2009, and Japan Patent Application No. JP2008-305709, filed on Nov. 28, 2008, the subject matters of which are hereby incorporated by reference.

BACKGROUND

The present disclosure relates to a nonvolatile semiconductor memory device, and more particularly, to a nonvolatile semiconductor memory device configured to decrease the number of programming times and/or a program current capacity.

Recently, nonvolatile semiconductor memory devices, particularly flash memories, have been enabled to electrically reprogram data, and to retain data even when a power supply source is turned off. Accordingly, flash memories are widely used as memory devices for portable equipment, such as portable phones and digital cameras.

Generally, a memory cell is programmed by applying a certain voltage higher than a power source voltage to a control gate of the memory cell, and a program current higher than a certain current level is required. Furthermore, since the high voltage applied to the control gate is generated through a charge pump included in the chip, the number of memory cells that may be simultaneously programmed is limited by the ability of the charge pump and/or layout restrictions.

For example, when the number of bits that may be simultaneously programmed is four, 16-bit data are divided into 4-bit segments and programmed a total of four times. Assuming that a state in which an electric charge is not left in a floating gate is set as logic 1, when programming n bits (where n is an integer), all of the n bits must be programmed when all bits are logic 0. Also, when programming is designed to be performed m bits at a time (where m is an integer, m>n), the ability of the charge pump is suppressed, from the restriction of a chip area, and the programming operation must be performed n/m times (or a number of times of the integer closest to and greater than n/m times) to program all of the n bits.

If the number of programming times increases, additional time is incurred for programming, which increases in proportion to the number of programming times. However, if the number of bits that may be programmed at a time is not set as m bits and programming is designed to be performed simultaneously to program all n bits, the area occupied by the chip of the charge pump must be larger, thus increasing consumption current and increasing product size.

Technology for shortening the average time taken for programming data is disclosed, for example, in Japan Patent Publication No. 2006-24347. However, the circuit configurations are complicated.

SUMMARY

Embodiments of the inventive concept provide a nonvolatile semiconductor memory device, which decreases the number of programming times when programming n-bit programming data input to a designated address.

Embodiments of the inventive concept also provide a nonvolatile semiconductor memory device, which decreases programming current capacity during the programming operation.

Embodiments of the inventive concept provide a nonvolatile semiconductor memory device including a memory cell array, having multiple memory cells for storing data, and a control circuit configured to control a reading operation for reading data from the memory cell array and a programming operation for inputting data to the memory cell array. The control circuit includes first and second units. The first unit is configured to count a number of bits having logic 0 or a number of bits having logic 1, to set a logic where the counted number is greater than n/2 as an initial state to regenerate programming data, and to perform a programming operation based on the regenerated data, when simultaneously programming the programming data of n bits which are input for a designated address. The second unit is configured to program a recognition bit for recognizing which of the logic 0 and the logic 1 the initial state of the memory cell of the designated address is in, when the programming operation is performed.

Accordingly, the maximum number of programming bits is n/2, and thus the maximum number of programming times may be reduced by half as compared to the typical number of programming times in conventional devices.

In some embodiments, when programming indicates shifting a state of a memory cell from the logic 1 to the logic 0, the control circuit may invert the input programming data of n bits to perform programming and programs inversion information as the recognition bit, when the number of bits of the logic 0 exceeds the number of bits of the logic 1. Therefore, an initial state may be set as the logic 0 based on the recognition bit.

In other embodiments, the control circuit may set the number of bits programmable at one time as m (where, m is an integer, and m<n/2), and perform the programming operation for a maximum number of division programming times to become n/2m times or integer times greater than and closest to n/2m times, wherein the maximum number of division programming times denotes maximum times when n bits are programmed in multiple stages. Thus, the maximum number of programming times may be reduced by half of the typical number of programming times.

In still other embodiments, the control circuit may perform the programming operation at a programming current capacity enough to input programming data of n/2 bits and the recognition bit. Consequently, a programming current capacity may be reduced by half of a typical programming current capacity.

In still other embodiments, before the programming operation for the designated address, the control circuit reads n-bit data and checks whether a memory cell corresponding to the designated address is in an initial state where the memory cell is not programmed. Accordingly, before the programming operation, the nonvolatile semiconductor memory device may determine whether the initial state is set as the logic 1 or the logic 0.

In other embodiments of the inventive concept, a nonvolatile semiconductor memory device includes a memory cell array having multiple memory cells for storing data, and a control circuit configured to control a reading operation of reading data from the memory cell array and a programming operation of inputting data to the memory cell array. The control circuit includes first, second and third units. The first unit is configured to count a number of bits having logic 0 or a number of bits having logic 1, to set a logic where the counted number is greater than n/2 as an initial state to regenerate programming data, and to perform a programming operation based on the regenerated data, when simultaneously programming the programming data of n bits which are input for a designated address. The second unit is configured to program a recognition bit for recognizing which of the logics 0 and 1 the initial state of the memory cell of the designated address is in, when the programming operation is performed. The a third unit is configured to input an initial bit for determining whether data are input to the designated address.

As a result, the nonvolatile semiconductor memory device may determine whether the designated address is in an initial state based on an initial bit, and in response to this, it may set the maximum number of programming bits for n bits as n/2.

In some embodiments, the control circuit may input the recognition bit and the initial bit in the programming operation. Accordingly, the nonvolatile semiconductor memory device may determine whether input data are inverted and programmed and whether the designated address is input.

In other embodiments, the control circuit may set the number of bits programmable at one time as m (where, m is an integer, and m<n/2), and perform the programming operation for the maximum number of division programming times to become (n+1)/2m times or integer times greater than and closet to (n+1)/2m times, wherein the maximum number of division programming times denotes maximum times when n bits are programmed in several stages. Thus, the maximum number of programming times may be reduced by half of the typical number of programming times.

In still other embodiments, the control circuit may set the number of bits programmable at one time as m (where, m is an integer, and m<n/2+1), and perform the programming operation for the maximum number of division programming times to become n/2m times or integer times greater than and closet to n/2m times, where the maximum number of division programming times denotes maximum times when n bits are programmed in several stages. Therefore, the maximum number of programming times may be reduced by half of the typical number of programming times.

In even other embodiments, the control circuit may perform the programming operation at a programming current capacity enough to input programming data of n/2 bits, the recognition bit and the initial bit. Consequently, a programming current capacity may be reduced by half of a typical programming current capacity.

In yet other embodiments, before the programming operation for the designated address, the control circuit may check whether a memory cell corresponding to the designated address is in an initial state where the memory cell is not programmed, based on data of the initial bit. Accordingly, by checking the initial bit, the nonvolatile semiconductor memory device may determine whether the initial state is set as the logic 1 or the logic 0 before the programming operation.

BRIEF DESCRIPTION OF THE DRAWINGS

The accompanying drawings are included to provide a further understanding of the embodiments of the inventive concept, and are incorporated in and constitute a part of this specification. Exemplary embodiments of the inventive concept will be described with reference to the attached drawings, in which:

FIG. 2 is a conceptual view for describing the operation principle of an embodiment of the inventive concept;

FIG. 6 is a diagram illustrating a table in which the number of division programming times when the number of bits input at one time is 4 bits, as compared with a typical case, according to an embodiment of the inventive concept;

FIGS. 8A and 8B are flowcharts illustrating a method for decreasing the number of programming times (where an initial bit is checked and verification is performed at one time for n bits), according to an embodiment of the inventive concept;

FIG. 9 is a diagram illustrating tables in which the number of division programming times is decreased with an initial bit, as compared with a typical case (where an initial bit is checked, and n=16, m=4), according to an embodiment of the inventive concept;

FIG. 10 is a diagram illustrating tables in which the number of division programming times is decreased with an initial bit, as compared with a typical case (where an initial bit is checked, and n=16, m=5), according to an embodiment of the inventive concept;

DETAILED DESCRIPTION OF THE EMBODIMENTS

Figure 1:
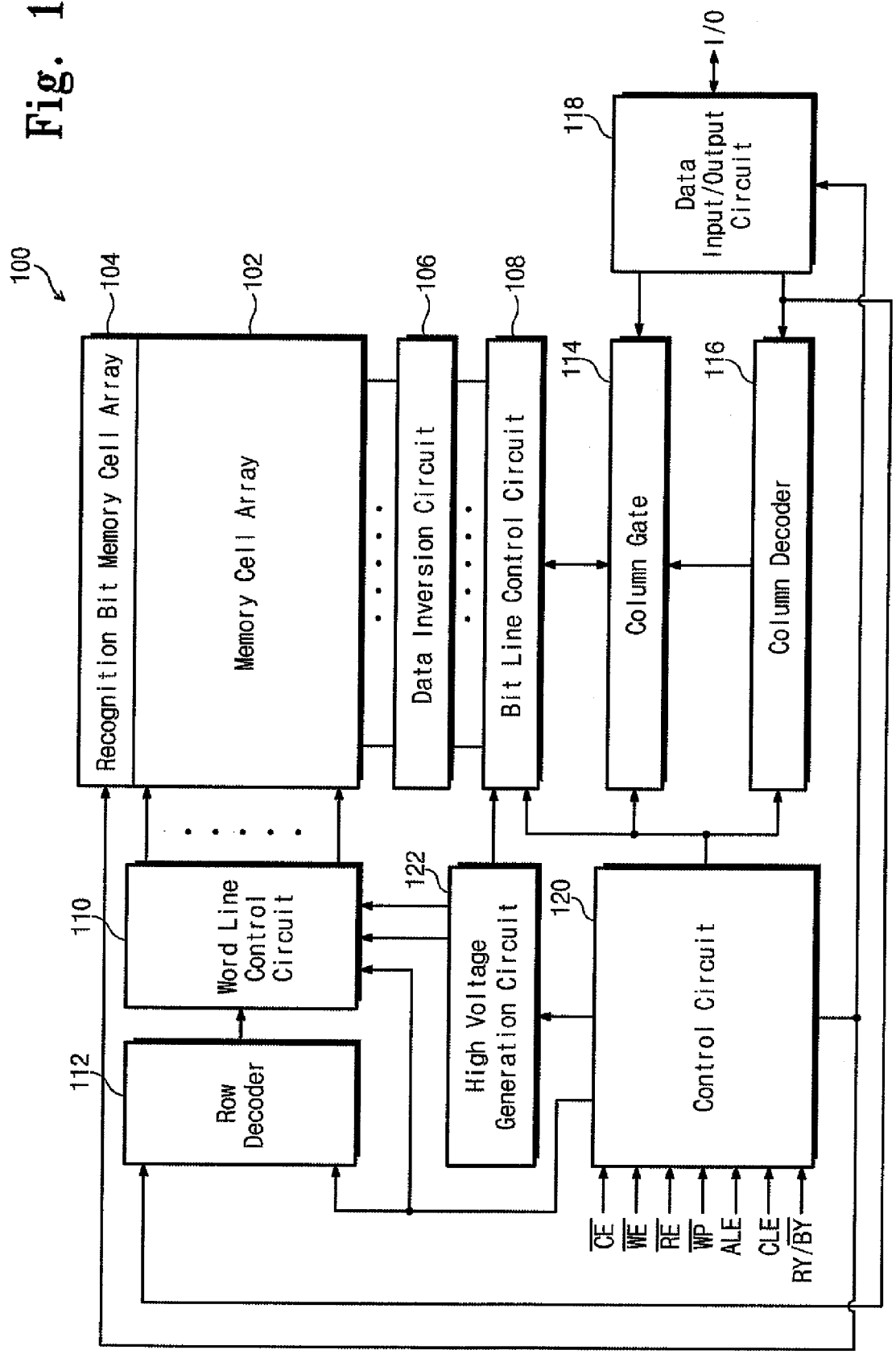
FIG. 1 is a block diagram illustrating a nonvolatile semiconductor memory device, according to an embodiment of the inventive concept.

Various embodiments will now be described more fully with reference to the accompanying drawings, in which illustrative embodiments are shown. The inventive concept, however, may be embodied in various different forms, and should not be construed as being limited only to the illustrated embodiments. Rather, these embodiments are provided as examples, to convey the inventive concept to one skilled in the art. Accordingly, known processes, elements, and techniques are not described with respect to some of the embodiments. Throughout the drawings and written description, like reference numerals will be used to refer to like or similar elements.

FIG. 1 is a block diagram illustrating a nonvolatile semiconductor memory device 100, according to an embodiment of the inventive concept.

Referring to FIG. 1, a memory cell array 102 includes multiple word lines and multiple bit lines, and memory cells arranged in a matrix form located at the intersections of the word lines and the bit lines. A word line control circuit 110 and a bit line control circuit 108 are connected to the memory cell array 102.

The word line control circuit 110 selects a specific word line from the word lines of the memory cell array 102 and applies voltages necessary for reading, programming and erasing operations to the selected word line. A row decoder 112 controls the word line control circuit 110, and selects a specific word line.

The bit line control circuit 108, as described below, includes multiple data latch circuits, and reads memory cell data from the memory cell array 102 through bit lines, verifies the states of the memory cells of the memory cell array 102 through the bit lines, or applies programming voltages to the memory cells of the memory cell array 102 to program the memory cells through the bit lines, respectively. A column gate 114, a column decoder 116 and a data input/output circuit 118 are connected to the bit line control circuit 108.

The data latch circuit (not shown) of the bit line control circuit 108 is selected by a column gate 114 and a column decoder 116, and the data of the memory cell array 102 that are read to the data latch circuit are output from a data input/output (I/O) terminal to the outside through the data input/output circuit 118. Data that are input from the outside to the data I/O terminal are input to the data latch circuit that is selected by the column gate 114 and the column decoder 116 through the data input/output circuit 118.

In an embodiment of the inventive concept, the memory device 100 recognizes an initial state of the memory cell at a designated address as logic 1 or logic 0, and stores the recognition result as a recognition bit corresponding to the memory cell. Therefore, a recognition bit memory cell array 104 is located near the memory cell array 102. The recognition bit is programmed by the control circuit 120 in a programming operation.

Further, in an embodiment of the inventive concept, when a program indicates that the state of a memory cell shifts from logic 1 to logic 0, the memory device 100 inverts n-bit programming data to input the inverted data to the memory cell array 102 when the number of bits having logic 0 exceeds or is equal to the number of bits having logic 1. Consequently, a data inversion circuit 106 is located between the memory cell array 102 and the bit line control circuit 108. The data inversion circuit 106 is controlled by the control circuit 120, and inversion-related information is programmed in the recognition bit memory cell array 104 as a recognition bit.

The control circuit 120 controls overall operation of the nonvolatile semiconductor memory device 100, for example, reading operations, programming operations and erasing operations. The control circuit 120 controls the word line control circuit 110, the row decoder 112, the bit line control circuit 108, the column gate 114, the column decoder 116, the data input/output circuit 118, a high voltage generation circuit 122, the recognition bit memory cell array 104 and the data inversion circuit 106.

The control circuit 120 receives a chip enable signal ICE, an input enable signal /WE, a read enable signal /RE, a command latch enable signal CLE, an address latch enable signal ALE and a write protect signal /WP from the outside and outputs a ready-busy signal Rn/B to the outside. In addition, an address, data and a command that are input to the data I/O terminal are input to the control circuit 120 through the data input/output circuit 118.

Generally, the nonvolatile semiconductor memory device 100 according to an embodiment of the inventive concept includes a memory cell array 102 configured with memory cells for storing data, and a control circuit 120 that controls a reading operation that reads data from the memory cell array 102 and a programming operation that inputs data on the memory cell array 102. The control circuit 120 includes first and second units (not shown). In a case of simultaneously programming n-bit programming data (where n is an integer) input to a designated address, the first unit counts only the number of bits having logic 0, counts only the number of bits having logic 1, or counts the number of bits having logic 1 and logic 0. The first unit sets a logic in which a counted number is greater than n/2 as an initial state to regenerate the programming data, and performs the programming operation based on the regenerated programming data. The second unit programs a recognition bit for recognizing which of the logic 1 and the logic 0 the initial state of the memory cell of the designated address is in, in the programming operation.

The nonvolatile semiconductor memory device 100 according to another embodiment of the inventive concept includes a memory cell array 102 configured with memory cells for storing data, and a control circuit 120 that controls a reading operation that reads data from the memory cell array 102 and a programming operation that inputs data on the memory cell array 102. The control circuit includes first, second and third units (not shown). In a case of simultaneously programming n-bit programming data (where n is an integer) input to a designated address, the first unit counts only the number of bits having logic 0, counts only the number of bits having logic 1, or counts the number of bits having the logic 1 and the logic 0. The first unit sets a logic in which a counted number is greater than n/2 as an initial state to regenerate the programming data, and performs the programming operation based on the regenerated programming data. The second unit programs a recognition bit for recognizing which of the logic 1 and the logic 0 the initial state of the memory cell of the designated address is in, in the programming operation. The third unit inputs the initial bit for determining whether data are input to the designated address.

The high voltage generation circuit 122 generates voltages necessary for the reading, programming and erasing operations of the nonvolatile semiconductor memory device 100.

In the nonvolatile semiconductor memory device 100, when programming data in a memory cell of the memory cell array 102, electron may be injected into the floating gate of the memory cell. In this case, a state in which electrons are not being collected in the floating gate refers to the logic 1, and a state in which electrons are being collected through injection is recognized as the logic 0.

When simultaneously programming n-bit data input from the outside, the nonvolatile semiconductor memory device 100 sets a logic in which the counted number of logic values is greater than n/2 as the initial state to regenerate programming data, and programs the regenerated data in the memory cell array 102.

FIG. 2 is a conceptual view for describing an operational principle of an embodiment of the inventive concept.

FIG. 2(A) illustrates that a state in which electrons are being collected in the floating gate of a memory cell is defined as logic 0. FIG. 2(B) illustrates that a state in which electrons are not being collected in the floating gate is defined as logic 1.

In an embodiment of the inventive concept, a recognition bit for recognizing whether an initial state is logic 0 or logic 1 is programmed in the recognition bit memory cell array 104. The recognition bit is programmed in a programming operation. In FIG. 2(A), the recognition bit is stored as logic 1. In FIG. 2(B), the recognition bit is stored as logic 0.

In a case of simultaneously programming n-bit programming data (where n is an integer) input to a designated address, the nonvolatile semiconductor memory device 100 counts only the number of bits having logic 0, counts only the number of bits having logic 1, or counts the number of bits having the logic 1 and the logic 0. The nonvolatile semiconductor memory device 100 sets a logic, in which the counted number greater than n/2 as an initial state.

In FIG. 2(A), since the number of bits "a" having logic 0 is less than (or equal to) half of the number of programming bits, the initial state is defined as logic 1. In FIG. 2(B), since the number of bits "a" having logic 0 is greater than half of the number of programming bits, the initial state is defined as logic 0. The nonvolatile semiconductor memory device 100 regenerates programming data according to the initial state, and performs a programming operation based on the regenerated data. In FIG. 2(B), because the initial state is defined as logic 0, the nonvolatile semiconductor memory device 100 inverts the n-bit programming data to perform the programming operation. A program commonly denotes shifting the state of a memory cell from logic 1 to logic 0. Generally, when determining recognition bit logic, the nonvolatile semiconductor memory device 100 writes inversion information as logic 0 as the recognition bit.

In FIG. 2A, because the initial state is defined as logic 1, input programming data is not inverted. In this case, logic 1 is input as the recognition bit.

In this manner, for n bits that have been programmed, the nonvolatile semiconductor memory device 100 programs a bit for recognizing whether the initial state of the memory cell is logic 0 or logic 1, obtaining matchability between programmed data and data to be output.

Figure 3:
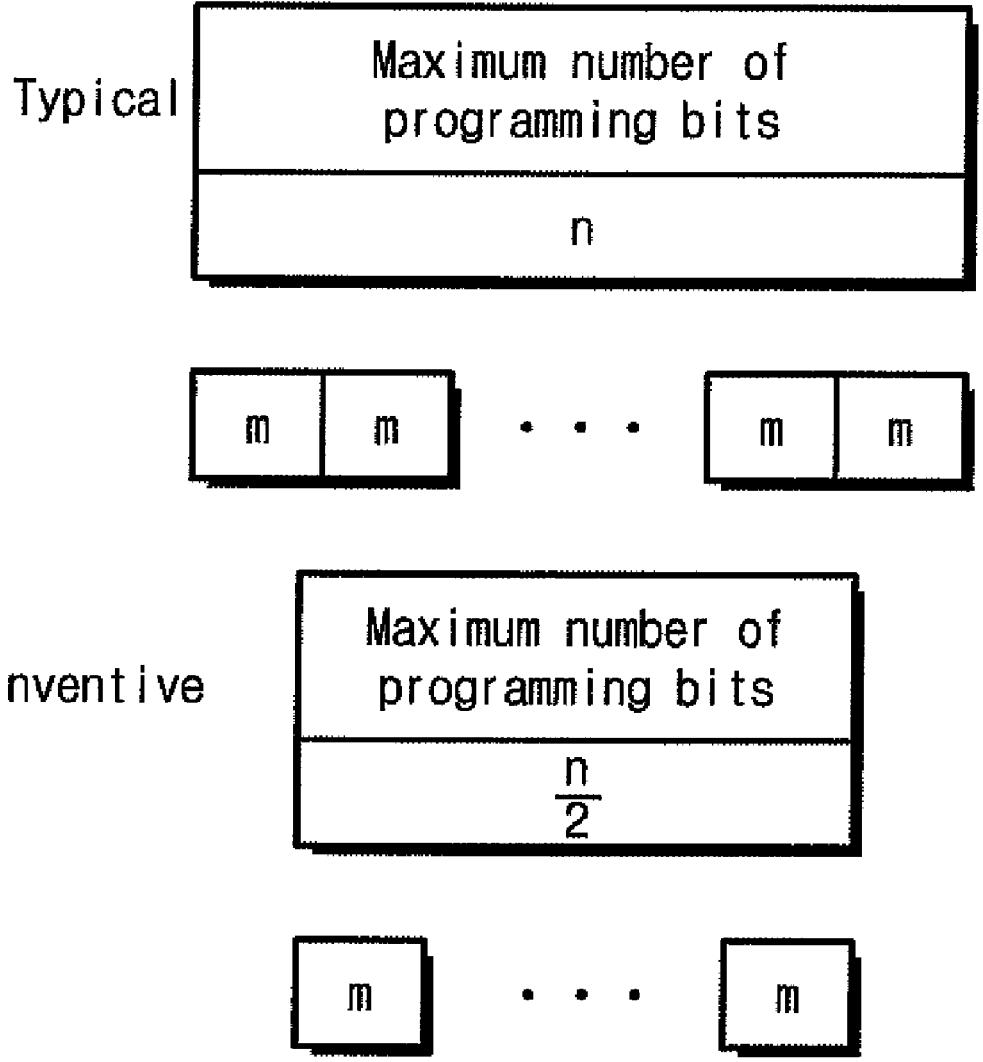
FIG. 3 is a conceptual view for describing a method of applying a nonvolatile semiconductor memory device, according to an embodiment of the inventive concept for improving the number of programming times.

FIG. 3 is a conceptual view illustrating a method for improving the number of programming times using the semiconductor memory device, according to an embodiment of the inventive concept.

Referring to FIG. 3, on the assumption of simultaneously programming n-bit data, when the number of bits programmable at one time is limited to m bits, e.g., due to the area of a charge pump for generating a necessary current, a typical or conventional method requires n/m times, or integer times greater than and closest to n/m times, for programming all n bits.

However, according to an embodiment of the inventive concept, because the maximum number of programming bits is n/2 for n bits input, the maximum number of division programming times is reduced by about half relative to conventional methods. Moreover, the semiconductor memory device according to an embodiment of the inventive concept reduces current during programming.

When simultaneously programming n-bit data, a current capacity for programming data divided by n bits is required for programming all n bits at one time. According to an embodiment of the inventive concept, because the maximum number of programming bits is n/2, a current capacity for programming fewer than all n bits at one time also becomes n/2.

A method for reducing the number of programming times or a programming current by a nonvolatile semiconductor memory device, according to an embodiment of the inventive concept, will be described with reference to FIGS. 4A though 12.

Figure 4A:
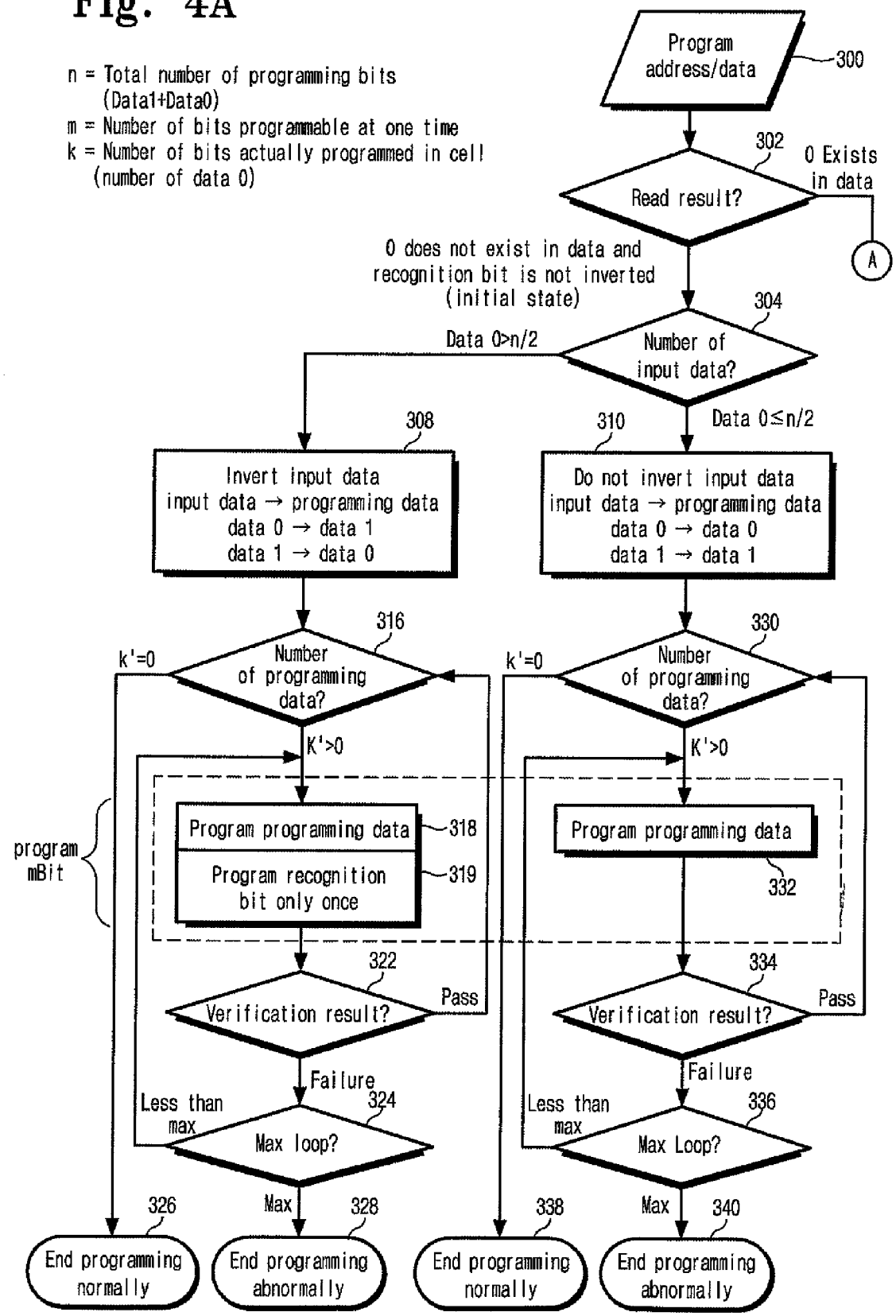
FIGS. 4A and 4B are flowcharts illustrating a method for decreasing the number of programming times (where verification is performed per m bit), according to an embodiment of the inventive concept.
Figure 4B:
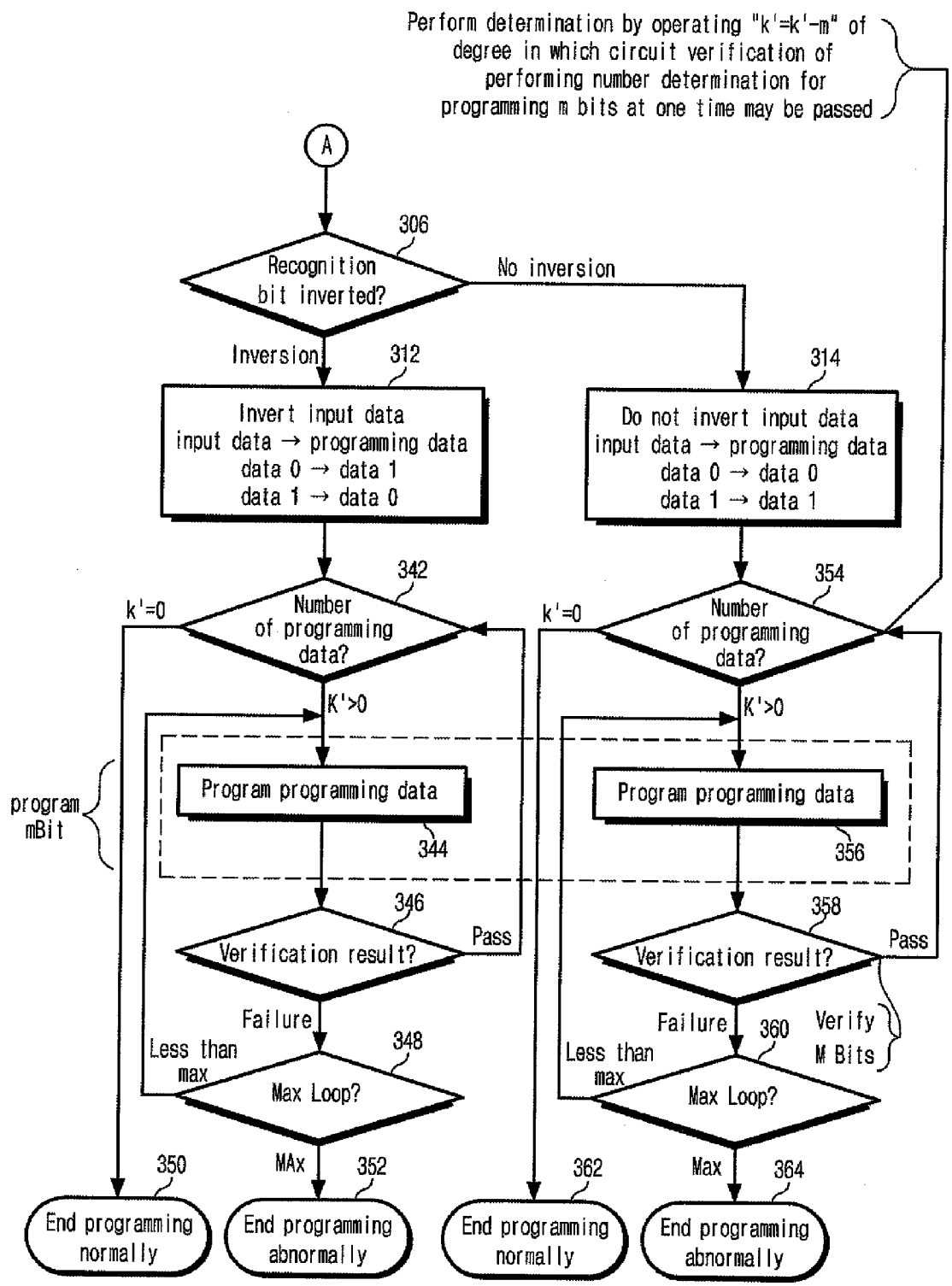

FIGS. 4A and 4B are flowcharts illustrating a method for programming while performing verification for each m bits of the n bits of input data to reduce the number of programming times.

Figure 5A:
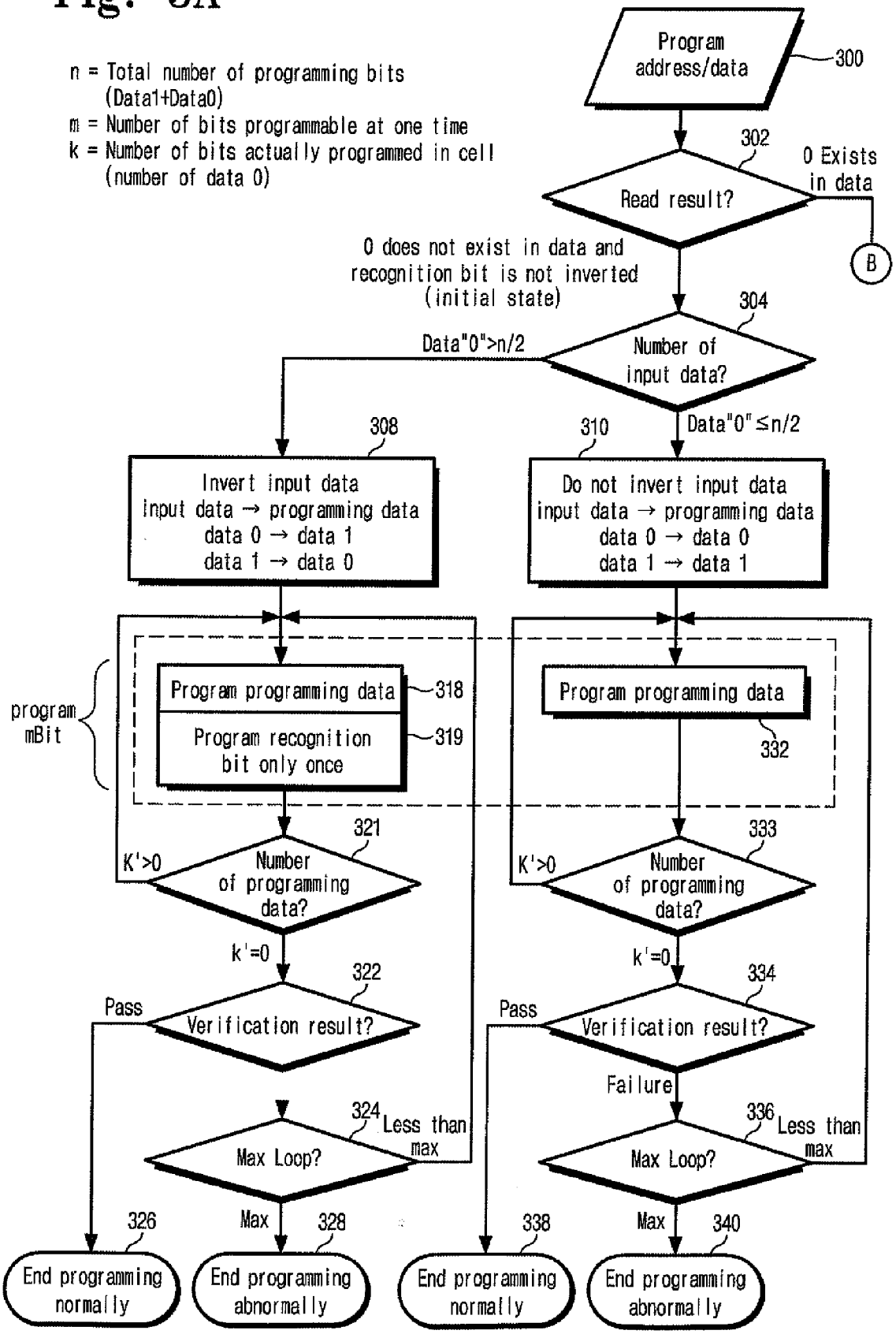
FIGS. 5A and 5B are flowcharts illustrating a method for decreasing the number of programming times (where verification is performed at one time for n bits), according to an embodiment of the inventive concept.
Figure 5B:
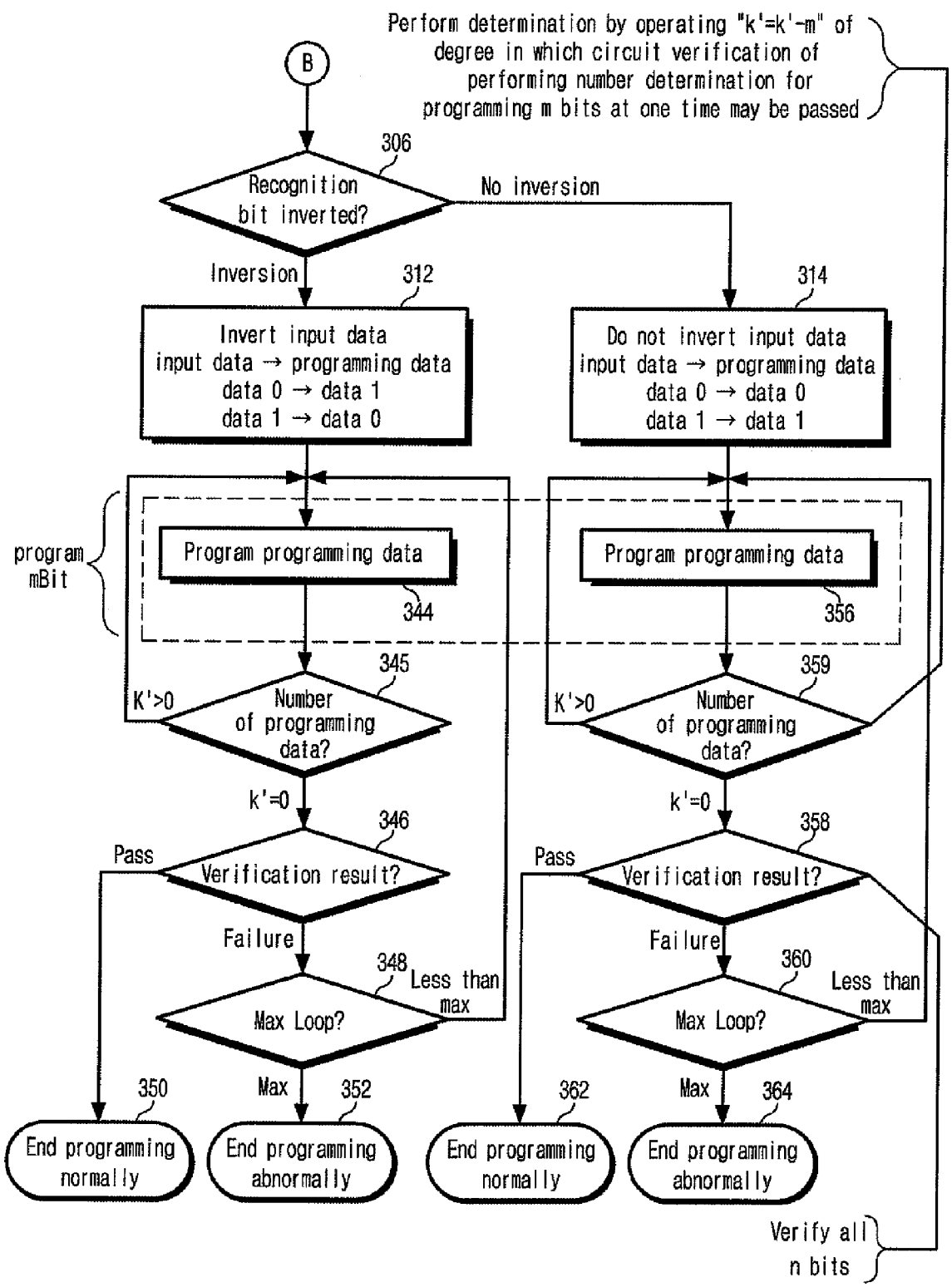

FIGS. 5A and 5B are flowcharts illustrating a method for inputting all n bits for programming per m bit on the n bits of input data and performing verification for n bits at one time to reduce the number of input times.

First, a case (operation 300) of programming n-bit data for a designated address in FIGS. 4A and 4B will be described below.

Referring to FIGS. 4A and 4B, the state of a designated address is checked before programming to determine whether it is in an initial state. For the designated address, the memory device 100 reads all n-bit data and checks for an initial state in operation 302. When logic 0 (referred to as data "0") does not exist in the data and a recognition bit is in a non-inversion state (i.e., an initial state), the memory device 100 proceeds to operation 304. When data "0" does exist in the data, the memory device 100 proceeds to operation 306 (in FIG. 4B). The memory device 100 determines the number of input data "0" in operation 304. When the number of input data "0" exceeds n/2, the memory device 100 proceeds to operation 308. When the number of input data "0" is less than or equal to n/2, the memory device 100 proceeds to operation 310.

The memory device 100 inverts the input data in operation 308. In other words, the memory device 100 inverts data "0" to input data "1", inverts data "1" into input data "0", and programs the inverted data in operation 308. In contrast, input data are input "as-is", without being inverted, in operation 310.

Referring again to operation 302, when it is determined that data "0" exists in the data, the memory device 100 checks a recognition bit in operation 306. When the recognition bit is inverted, the memory device 100 proceeds to operation 312, and inverts the input data. When the recognition bit is not inverted, the memory device 100 proceeds to operation 314, and inputs data "as-is", without inversion.

The recognition bit is a bit that is used for determining whether input data are inverted and programmed, and particularly are ready in an embodiment of the inventive concept. By checking the recognition bit, when additionally programming for an address that has been already input, the memory device 100 may determine whether to invert input data in accordance with a previous state.

In FIGS. 4A and 4B, for programming by m bits, the memory device 100 determines the number of input data in operations 316, 330, 342 and 354. The number determination may be performed as follows.

The number of data "0" (i.e., data which are actually programmed) is k, the memory device 100 calculates "k'=k'−m" each time verification is passed. When the value of the calculated k' is equal to or greater than "0", the memory device 100 further performs programming, and terminates programming at a time when "0". The result of the number determination refers to the number of division programming times.

When it is determined that k'>0 in operation 316, the memory device 100 programs input data in operation 318. By inverting input data for the first time to program n bits, the memory device 100 writes "0" in the recognition bit in operation 319. When it is determined k'=0 in operation 316, the memory device 100 normally ends the programming operation.

Subsequently, the memory device 100 verifies whether to program normally in operation 322. When the verification is passed, the memory device 100 returns to operation 316 and determines the number of input data. When succeeding input data exists, the memory device 100 performs programming. When failure, the memory device 100 determines whether the maximum loop has been reached in operation 324. The determination of the maximum loop is to determine whether a predetermined number of programming times have taken place. That is, when the verification fails, because programming is not normally performed, the input operation is performed again. However, to prevent the input operation from being repeated infinitely, the memory device 100 sets the maximum loop. When less than or equal to the maximum loop, the memory device 100 again performs the input operation and performs verification. When failure reaches the maximum loop, the memory device 100 terminates programming. In this case, programming is abnormally ended in operation 328.

Because operations 330 to 340, operations 342 to 352 and operations 354 to 364 are the same as operations 316 to 328, the description of these operations will not be repeated. In operations 330 to 340, operations 342 to 352 and operations 354 to 364, the memory device 100 does not perform programming of a recognition bit in which the memory device 100 inputs "0" to a recognition bit. This is because it is not required to invert input data and input the inverted data, or "0" has already been inputted and thereby the recognition bit is inverted. In this way, the programming of the recognition bit is performed only once.

Programming in FIGS. 5A and 5B is performed according to substantially the same operations as those of FIGS. 4A and 4B. However, in FIGS. 5A and 5B, the memory device 100 performs input before operations 321, 333, 345 and 358 in which the number of input data is determined for performing verification for n bits at one time to perform operations 318, 332, 344 and 356 of programming data, and verifies all n bits in verification operations 322, 334, 346 and 359. In this viewpoint, the operations of FIGS. 5A and 5B differ from those of FIGS. 4A and 4B.

In this case, the memory device 100 may perform operations 321, 333, 345 and 358 of determining the number of input data as follows. Where the number of data "0" (i.e., data which are actually programmed) is k, the memory device 100 calculates "k'=k'−m" each time programming is performed once when determining a number. When the value of the calculated k' is greater than or equal to "0", the memory device 100 further performs programming, and terminates programming at a time when "0". The result of the number determination refers to the number of division programming times.

FIG. 6 is a diagram illustrating a table showing the number of division programming times in a case where four bits are input at one time (m=4). Thus, the case in which 16 bits of input data (n=16) according to an embodiment is compared with a typical case.

Referring to FIG. 6, a typical worst case is when all of the bits of data D0 to D15 are data "0". In this case, the number of division programming times is four in a conventional memory device.

However, according to an embodiment, because the number of data "0" (i.e., 16 bits)>n/2 (i.e., 8), the memory device inverts the input data, so that data "0" becomes data "1", and the recognition bit is set to data "0". Accordingly, following the inversion operation, there is only one data "0" (the recognition bit). Therefore, the number of division programming times is only one.

FIG. 6 further depicts various situations in which the data D0 to D15 are not all data "0", illustrated as cases 1 through 3, according to an embodiment of the inventive concept. For example, in cases 1 and 2, the number of bits of input data that are data "0" is less than n/2 (case 1) or equal to n/2 (case 2). Therefore, no inversion operation is performed and the recognition bit is set to data "1", so the number of division programming times is two. In case 3, the number of bits of input data that are data "0" is greater than n/2. Therefore, an inversion operation is performed and the recognition bit is set to data "0". The number of division programming times based on the inversion operation is two.

Referring to FIG. 6, the maximum number of division programming times is four in a typical conventional method. However, in accordance with embodiments of the inventive concept, the maximum number of division programming times is two, thus decreasing the number of programming times.

In this way, when only m bits are programmed at one time, the maximum number of input times is n/2m or integer times greater than and closest to n/2m in an embodiment of the inventive concept. Accordingly, the maximum number of input times decreases by half relative to a conventional method.

FIGS. 7A, 7B, 8A and 8B are flowcharts illustrating a method of checking an initial bit and programming, according to an embodiment. The initial bit is one that is used to determine whether a designated address is input when programming, and particularly is set in an embodiment of the inventive concept.

In FIGS. 4A and 4B or FIGS. 5A and 5B, because an initial bit is not used, the memory device 100 must read all of the n bits of a designated address before a programming operation and check whether there is an initial state. By setting the initial bit, the memory device 100 easily determines whether of the initial state when desiring to additionally program. However, programming bits increase.

Figure 7A:
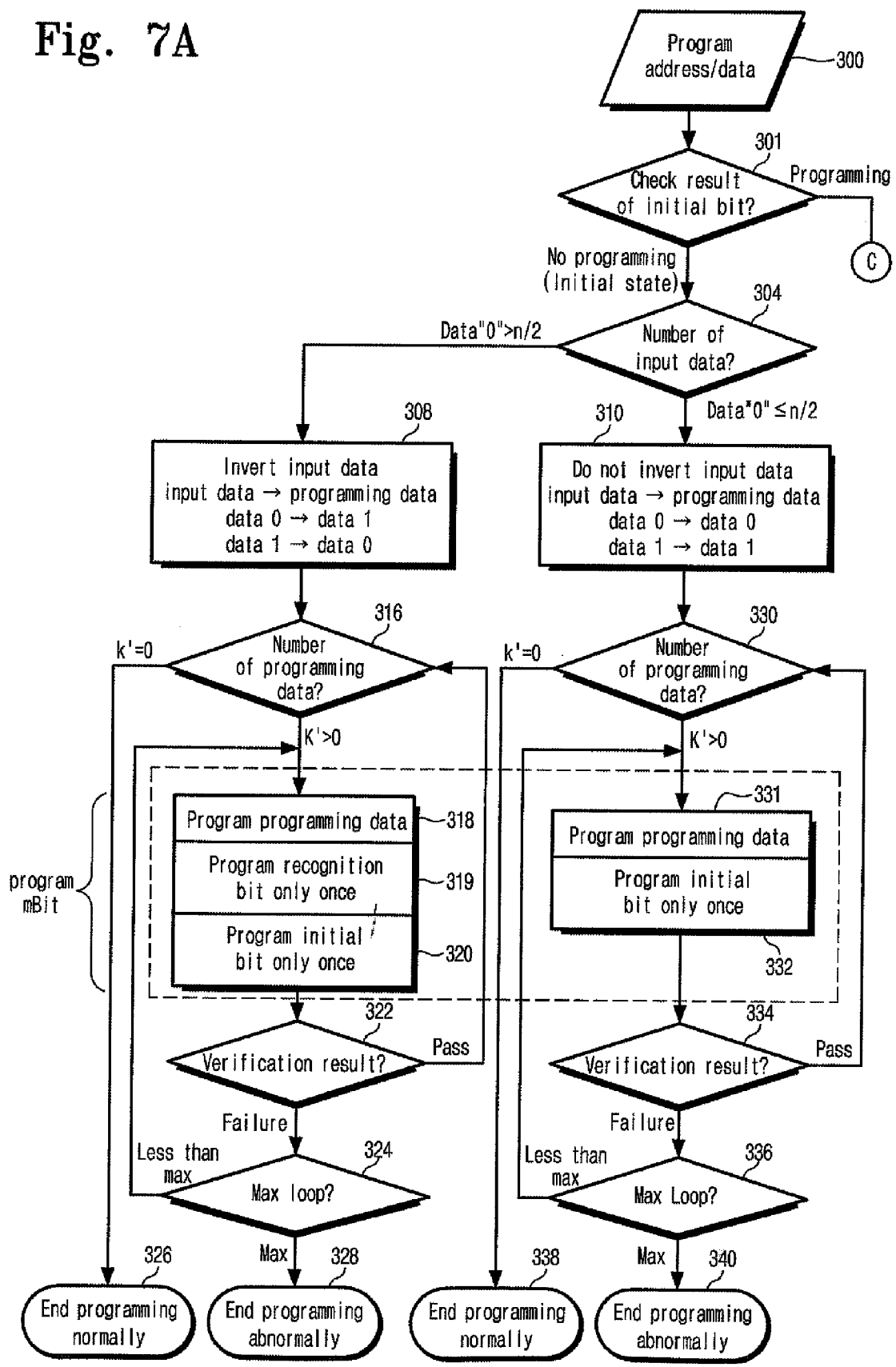
FIGS. 7A and 7B are flowcharts illustrating a method for decreasing the number of programming times (where an initial bit is checked and verification is performed per m bit), according to an embodiment of the inventive concept.
Figure 7B:
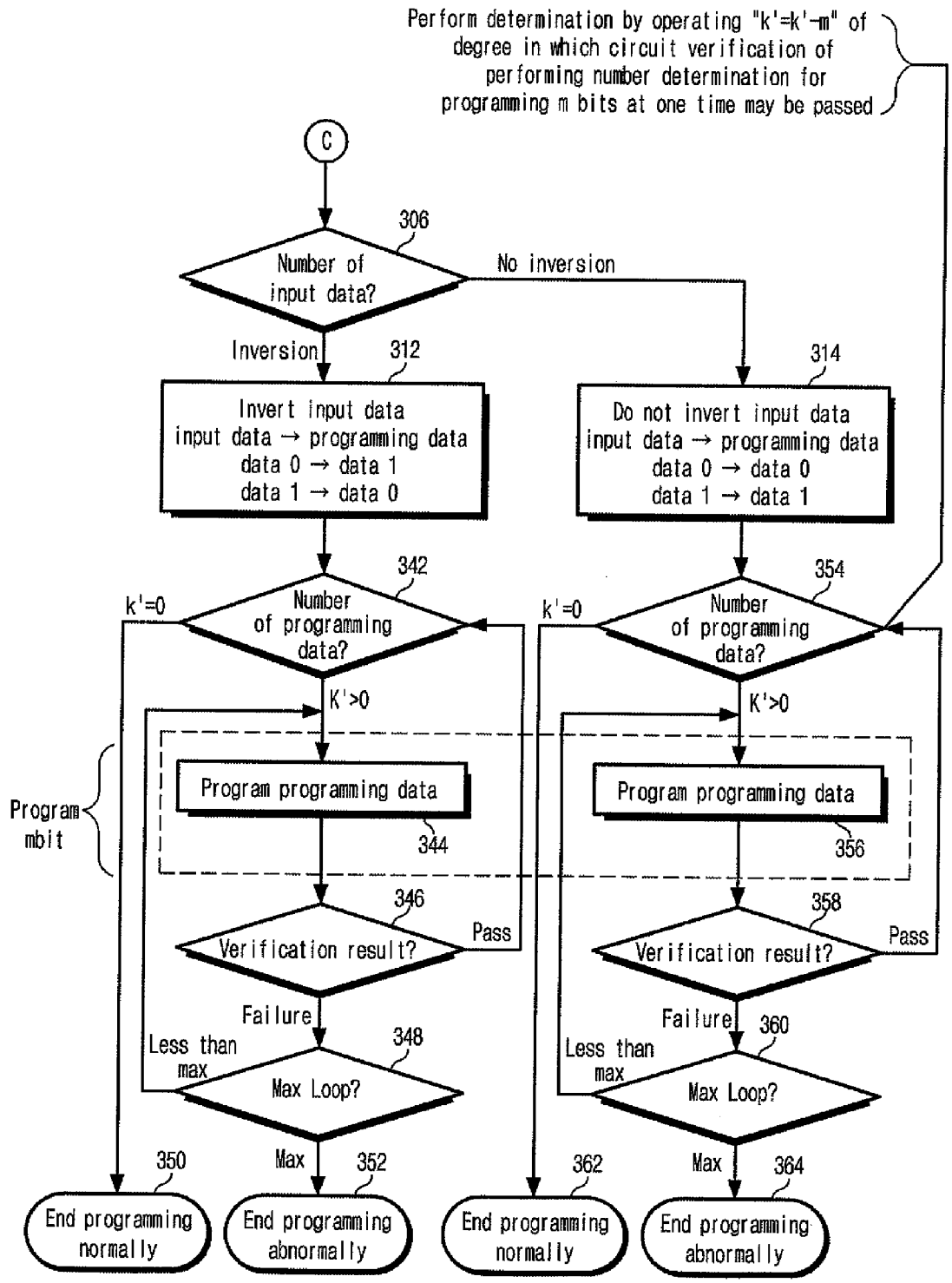
Figure 8B:
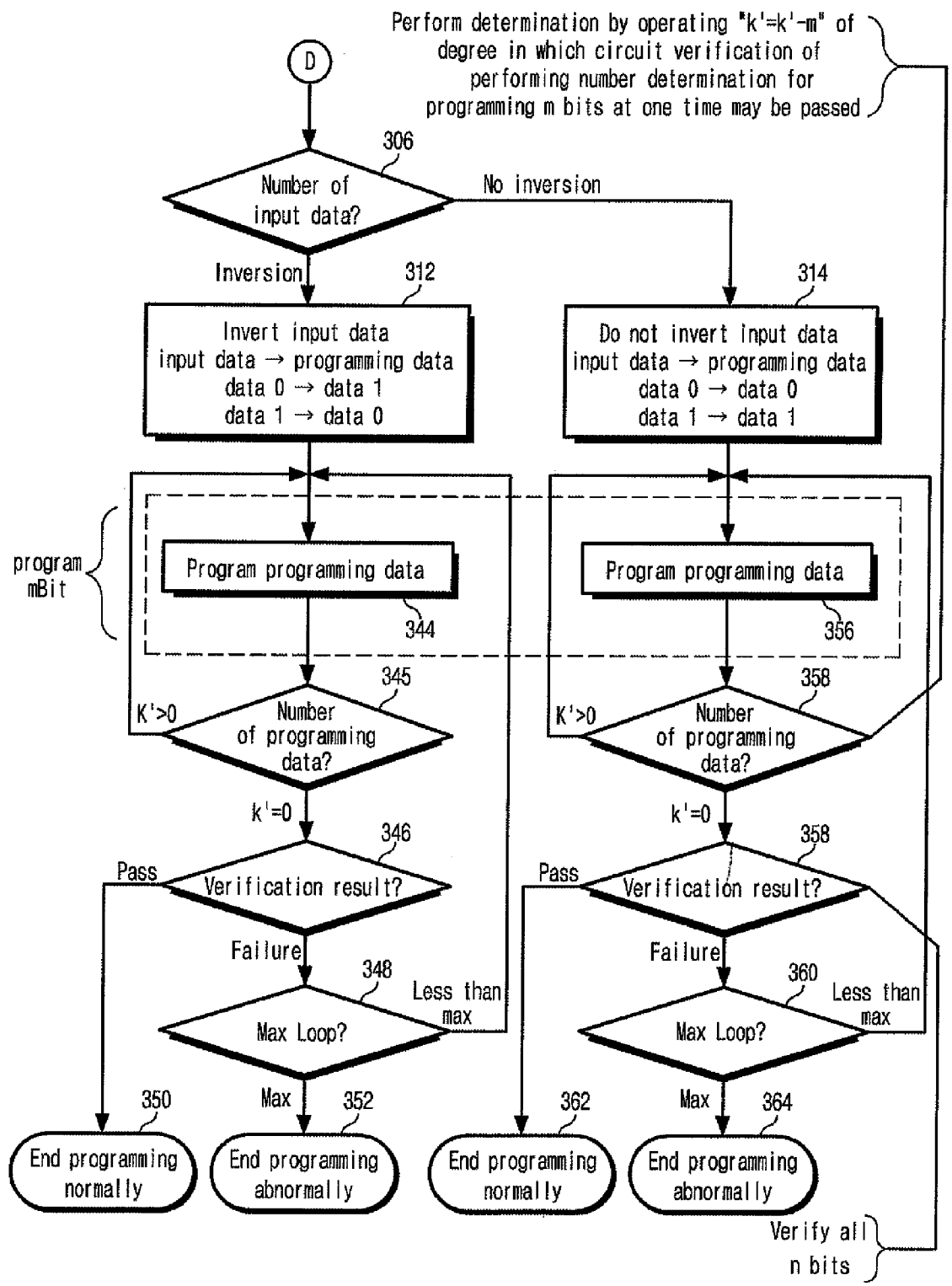

FIGS. 7A and 7B correspond to FIGS. 4A and 4B, and FIGS. 8A and 8B correspond to FIGS. 5A and 5B, respectively. The differences between FIGS. 7A, 7B, 8A and 8B and FIGS. 4A, 4B, 5A and 5B are as follows. First, operation 301 of checking whether an initial bit is inputted is performed. Second, operations 320 and 332 are performed in which the memory device 100 inputs an initial bit when the initial bit is not inputted. Also, the programming of the initial bit is performed only once.

In FIGS. 7A, 7B, 8A and 8B, the same operations as those of FIGS. 4A, 4B, 5A and 5B are indicated by the same reference numerals. According, the corresponding descriptions will not be repeated.

In FIGS. 7A, 7B, 8A and 8B, by checking the initial bit in operation 301, the memory device 100 determines whether a designated address is in an initial state. When input is not performed (i.e., the initial state), the memory device 100 proceeds to operation 304. When input is performed, the memory device 100 proceeds to operation 306.

FIGS. 9 and 10 are diagrams illustrating tables in which a case of reducing the number of division programming times with an initial bit is compared with a typical case.

FIG. 9 illustrates a case in which the number of bits input at one time is four bits (m=4), and the number of bits of input data is 16 bits (n=16). FIG. 10 illustrates a case in which the number of bits input at one time is five bits (m=5), and the number of bits of input data is 16 bits (n=16).

FIG. 9 is a diagram illustrating a table showing the number of division programming times in a case where four bits are input at one time (m=4). FIG. 10 is a diagram illustrating a table showing the number of division programming times in a case where five bits are input at one time (m=5).

In FIGS. 9 and 10, even when the memory device 100 checks an initial bit and performs programming, the number of division programming times may be decreased despite the increase of the number of input bits.

FIGS. 11A, 11B, 12A and 12B are flowcharts illustrating methods which combine data inversion circuits on the n bits of input data to perform programming and thereby reduces a current.

Figure 11A:
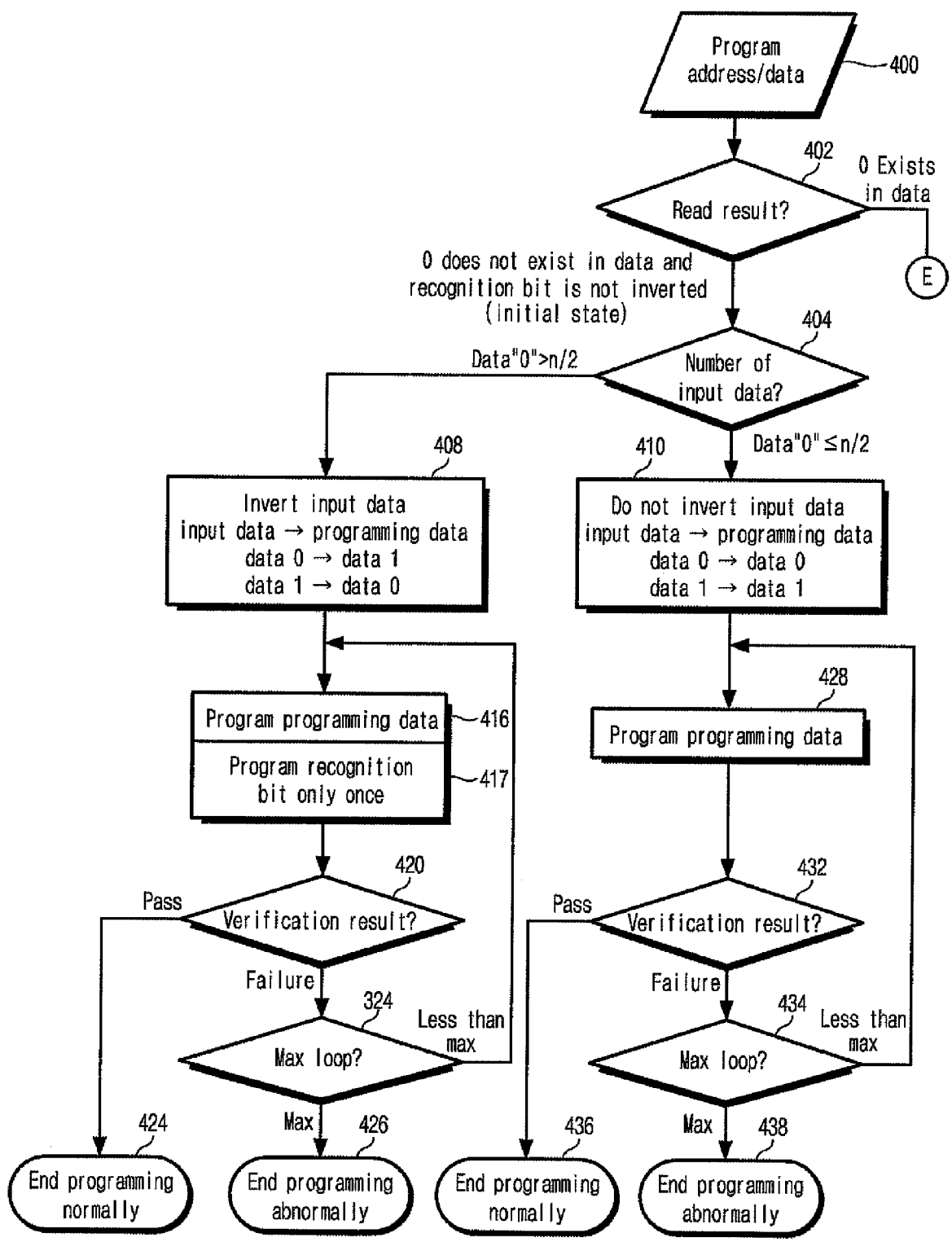
FIGS. 11A and 11B are flowcharts illustrating a method of decreasing a programming current, according to an embodiment of the inventive concept.
Figure 11B:
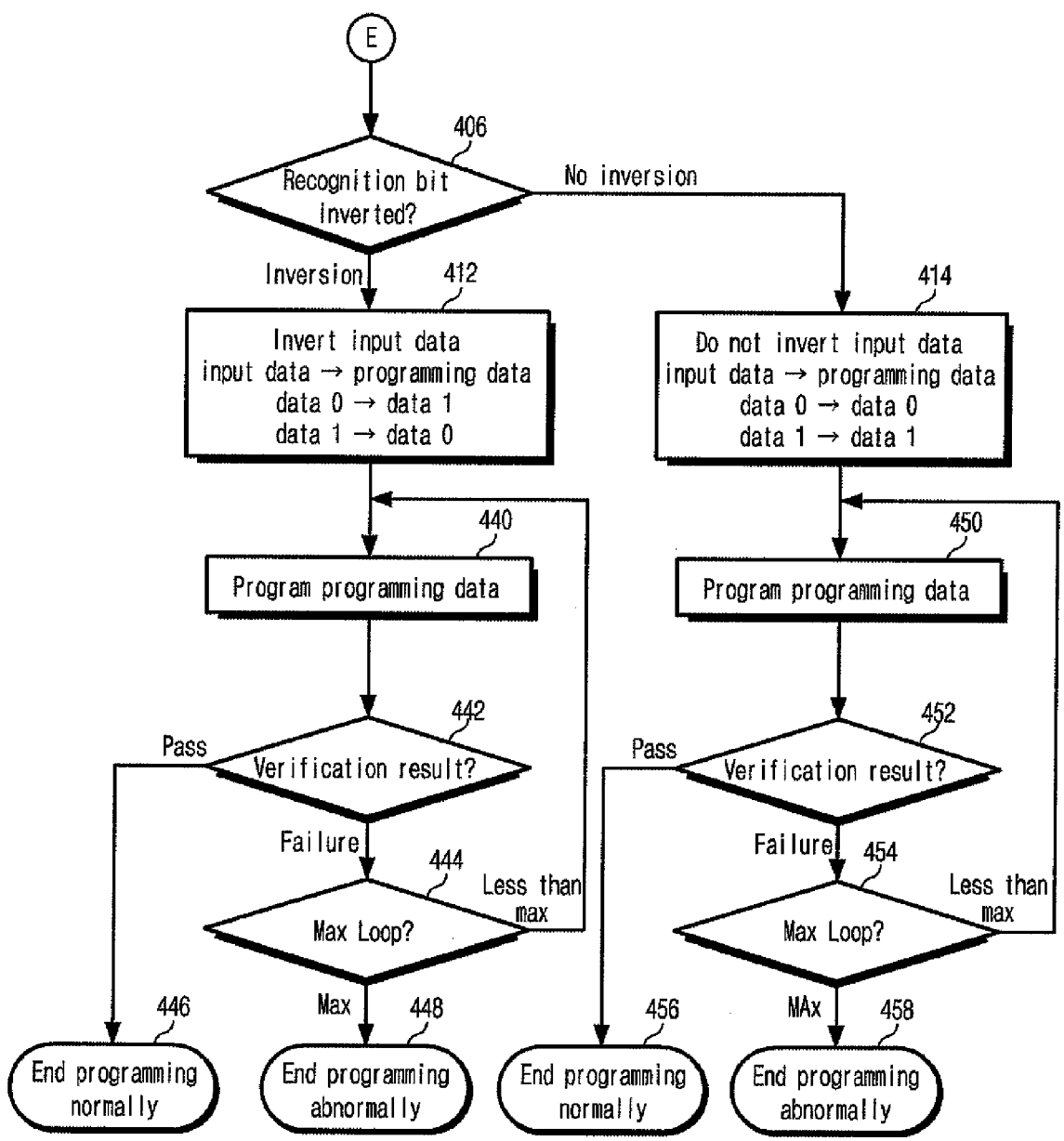
Figure 12A:
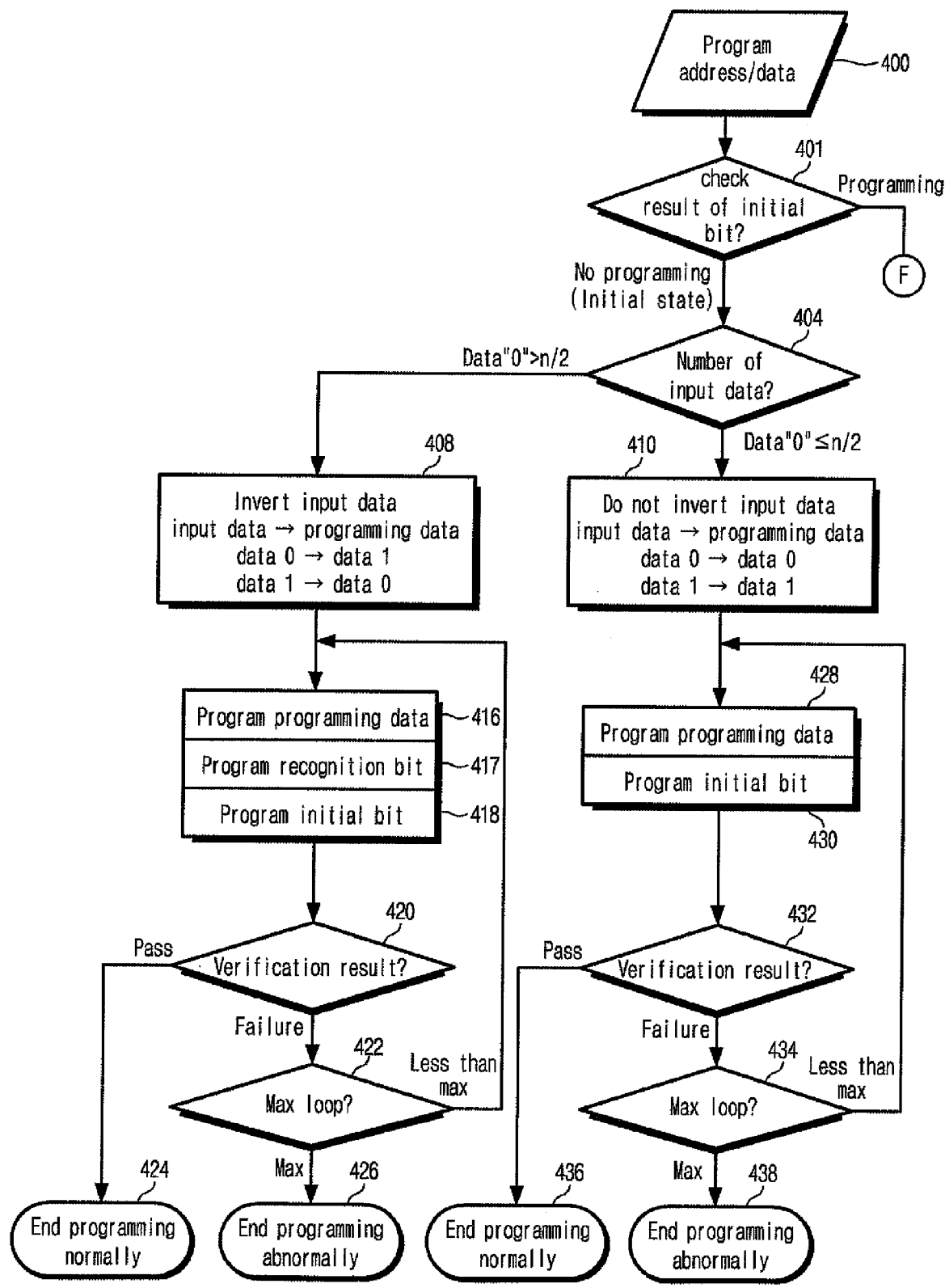
FIGS. 12A and 12B are flowcharts illustrating a method of decreasing a programming current (in a case of checking an initial bit), according to an embodiment of the inventive concept.
Figure 12B:
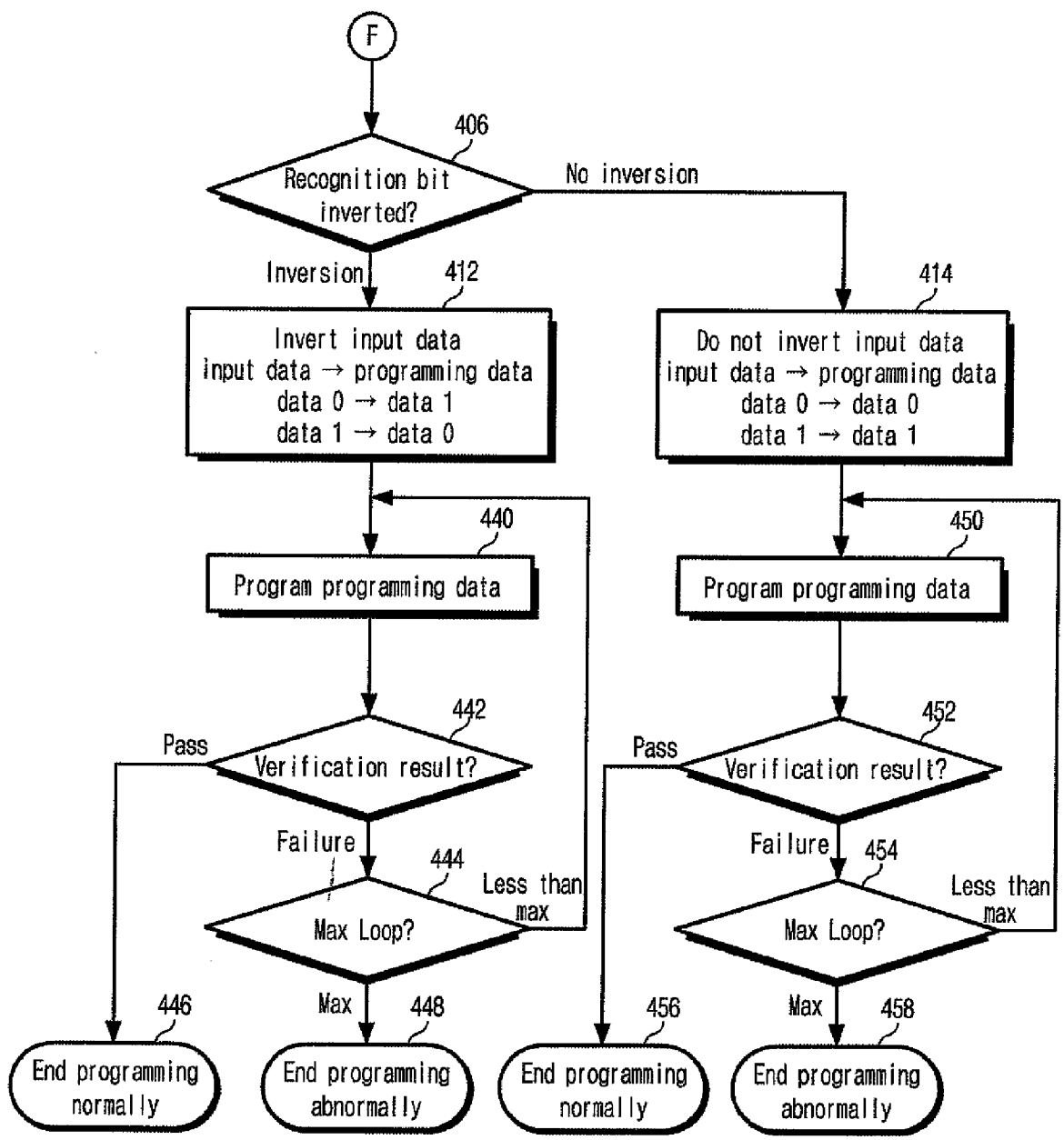

FIGS. 11A and 11B illustrate a case in which the memory device 100 does not input an initial bit and performs programming. FIGS. 12A and 12B illustrate a case in which the memory device 100 performs programming with an initial bit.

In FIGS. 11A, 11B, 12A and 12B, the same operations are indicated by the same reference numerals.

In FIGS. 11A and 11B, operation 400 will be first described in which the memory device 100 programs n-bit data for a designated address.

For the designated address, the memory device 100 reads all of the n-bit data and checks the initial states in operation 402. When data "0" does not exist in the data and the recognition bit is not inverted (i.e., indicating an initial state), the memory device 100 proceeds to operation 404. When data "0" does exist in the data, the memory device 100 proceeds to operation 406. The memory device 100 determines the number of input data in operation 404. When the number of data "0" exceeds n/2, the memory device 100 proceeds to operation 408. When the number of data "0" is less than or equal to n/2, the memory device 100 proceeds to operation 410.

In operation 408, the memory device 100 inverts the input data to make it inverted programming data in operation 408. That is, the memory device 100 inverts data "0" to data "1", inverts data "1" to data "0", and programs the inverted data. In operation 410, the input data are programmed "as-is", without being inverted.

Referring again to operation 402, when data "0" exists in the input, the memory device 100 checks a recognition bit in operation 406. When the recognition bit is inverted, the memory device 100 proceeds to operation 412, and inverts the input data to make it programming data. When the recognition bit is not inverted, the memory device 100 proceeds to operation 414, and uses input data as programming data without inversion.

In operations 416, 428, 440 and 450, input data are programmed. In operation 417, a recognition bit is programmed. Verification operations 420, 432, 442 and 452 and operations 422, 434, 444 and 454 of determining the maximum loop are performed after the programming of the input data and the programming of the recognition bit. However, because these operations are substantially the same as operations 322, 334, 346 and 358 and operations 324, 336, 348 and 360 of FIGS. 4A and 4B, respectively, the corresponding descriptions will not be repeated.

In this way, by configuring a data inversion circuit for the n bits of input data, the maximum input bit is n/2. Accordingly, when inputting n bits at one time, a current capacity divided by "n/(2 bits)+recognition bit" is required.

Compared with FIGS. 11A and 11B, a method of checking an initial bit to perform programming in FIGS. 12A and 12B further performs operation 401 of checking the initial bit and operation 418 of programming the initial bit.

Herein, the initial bit is one that is used to determine whether a designated address is input when programming, and particularly is set in an embodiment of the inventive concept.

In FIGS. 11A, 11B, 12A and 12B, the same operations are indicated by the same reference numerals.

In FIGS. 12A and 12B, by checking the initial bit in operation 401, the memory device 100 determines whether the designated address is in an initial state. When input is not performed (i.e., an initial state), the memory device 100 proceeds to operation 404. When input is performed, the memory device 100 proceeds to operation 406. When the memory device 100 checks the initial bit to perform programming, a current capacity divided by "n/(2 bits)+recognition bit+initial bit" is required.

According to embodiments of the inventive concept, when programming data that are input are simultaneously programmed on a designated address, the number of programming times decreases by half. Also, because a programming current capacity decreases in programming, the chip area may be decreased.

While the present inventive concept has been described with reference to exemplary embodiments, it will be apparent to those skilled in the art that various changes and modifications may be made without departing from the spirit and scope of the present teachings. Therefore, it should be understood that the above embodiments are not limiting, but illustrative.

What is claimed is:

1. A nonvolatile semiconductor memory device, comprising:
   a memory cell array comprising a plurality of memory cells for storing data; and
   a control circuit configured to control a reading operation for reading data from the memory cell array and a programming operation for inputting data to the memory cell array,
   wherein the control circuit comprises:
      a first unit configured to count a number of bits having logic 0 or a number of bits having logic 1, to set a logic where the counted number is greater then n/2 as an initial state to regenerate programming data, and to perform a programming operation based on the regenerated data, when simultaneously programming the programming data of n bits which are input for a designated address; and
      a second unit configured to program a recognition bit for recognizing which of the logic 0 and the logic 1 the initial state of the memory cell of the designated address is in, when the programming operation is performed.

2. The nonvolatile semiconductor memory device of claim 1, wherein when programming indicates shifting a state of a memory cell from the logic 1 to the logic 0, the control circuit inverts the input programming data of n bits to perform programming and programs inversion information as the recognition bit, when the number of bits of the logic 0 exceeds the number of bits of the logic 1.

3. The nonvolatile semiconductor memory device of claim 1, wherein the control circuit sets the number of bits programmable at one time as m (where, m is an integer, and m<n/2), and performs the programming operation for a maximum number of division programming times to become n/2m times or integer times greater than and closest to n/2m times, wherein the maximum number of division programming times denotes maximum times when n bits are programmed in stages.

4. The nonvolatile semiconductor memory device of claim 1, wherein the control circuit performs the programming operation at a programming current capacity enough to input programming data of n/2 bits and the recognition bit.

5. The nonvolatile semiconductor memory device of claim 1, wherein before the programming operation for the designated address, the control circuit reads n-bit data and checks whether a memory cell corresponding to the designated address is in an initial state where the memory cell is not programmed.

6. A nonvolatile semiconductor memory device, comprising:
   a memory cell array comprising a plurality of memory cells for storing data; and
   a control circuit configured to control a reading operation of reading data from the memory cell array and a programming operation of inputting data to the memory cell array, wherein the control circuit comprises:
a first unit configured to count a number of bits having logic 0 or a number of bits having logic 1, to set a logic where the counted number is greater than n/2 as an initial state to regenerate programming data, and to perform a programming operation based on the regenerated data, when simultaneously programming the programming data of n bits which are input for a designated address;
a second unit configured to program a recognition bit for recognizing which of the logics 0 and 1 the initial state of the memory cell of the designated address is in, when the programming operation is performed; and
a third unit configured to input an initial bit for determining whether data are input to the designated address.

7. The nonvolatile semiconductor memory device of claim 6, wherein the control circuit inputs the recognition bit and the initial bit in the programming operation.

8. The nonvolatile semiconductor memory device of claim 6, wherein the control circuit sets the number of bits programmable at one time as m (where, m is an integer, and m<n/2), and performs the programming operation for the maximum number of division programming times to become (n+1)/2m times or integer times greater than and closet to (n+1)/2m times, wherein the maximum number of division programming times denotes maximum times when n bits are programmed in several stages.

9. The nonvolatile semiconductor memory device of claim 6, wherein the control circuit sets the number of bits programmable at one time as m (where, m is an integer, and m<n/2+1), and performs the programming operation for the maximum number of division programming times to become n/2m times or integer times greater than and closet to n/2m times, wherein the maximum number of division programming times denotes maximum times when n bits are programmed in several stages.

10. The nonvolatile semiconductor memory device of claim 6, wherein the control circuit performs the programming operation at a programming current capacity enough to input programming data of n/2 bits, the recognition bit and the initial bit.

11. The nonvolatile semiconductor memory device of claim 6, wherein before the programming operation for the designated address, the control circuit checks whether a memory cell corresponding to the designated address is in an initial state where the memory cell is not programmed, based on data of the initial bit.

* * * * *